US011193366B2

(12) United States Patent
Xue

(10) Patent No.: US 11,193,366 B2
(45) Date of Patent: Dec. 7, 2021

(54) HIGH-TEMPERATURE SOLID STATE RESONANT GYROSCOPE AND DRILLING MEASUREMENT SYSTEM COMPOSED THEREBY

(71) Applicant: INSTITUTE OF GEOLOGY AND GEOPHYSICS, CHINESE ACADEMY OF SCIENCES, Beijing (CN)

(72) Inventor: Xu Xue, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 17/137,719

(22) Filed: Dec. 30, 2020

(65) Prior Publication Data
US 2021/0348504 A1 Nov. 11, 2021

Related U.S. Application Data

(63) Continuation of application No. PCT/CN2020/090518, filed on May 15, 2020.

(30) Foreign Application Priority Data

May 11, 2020 (CN) .......................... 202010393251.6
May 11, 2020 (CN) .......................... 202020768597.5

(51) Int. Cl.
*E21B 47/017* (2012.01)
*E21B 47/0228* (2012.01)
(Continued)

(52) U.S. Cl.
CPC ........ *E21B 47/0228* (2020.05); *E21B 47/017* (2020.05); *E21B 47/0224* (2020.05);
(Continued)

(58) Field of Classification Search
CPC .. E21B 47/0228; E21B 47/0224; E21B 47/14; E21B 47/017; E21B 47/13; B81B 2201/0242; G01C 19/56; G01C 21/183
See application file for complete search history.

(56) References Cited

U.S. PATENT DOCUMENTS 5,656,777 A * 8/1997 Petri ................... G01C 19/5719
73/504.12
9,919,472 B1 * 3/2018 Cohen ..................... B23K 26/40
(Continued)

*Primary Examiner* — Taras P Bemko
(74) *Attorney, Agent, or Firm* — Grossman, Tucker, Perreault & Pfleger, PLLC

(57) ABSTRACT

A high-temperature miniaturized resonant gyroscope, which comprises a resonator, a circuit board, a piezoelectric element, a supporting base, a shell and a binding post, wherein the resonator is arranged in the shell and connected with the supporting base, the piezoelectric element is connected with the binding post through a metal conductor, and key process points of internal elements of the gyroscope are fixedly connected by high-temperature materials and high-temperature processes. The gyroscope is a small-sized gyroscope capable of working at a high temperature; the present disclosure also provides an inertial navigation system, which comprises a triaxial gyroscope, a triaxial accelerometer and a damper, wherein the gyroscope is fixedly connected with the damper, and the gyroscope adopts the high-temperature resonant gyroscope. A drilling measurement system and a measurement method.

13 Claims, 10 Drawing Sheets

(51) Int. Cl.
*G01C 21/16* (2006.01)
*E21B 47/0224* (2012.01)
*E21B 47/14* (2006.01)
*G01C 19/56* (2012.01)
*E21B 47/13* (2012.01)

(52) U.S. Cl.
CPC .............. *E21B 47/14* (2013.01); *G01C 19/56* (2013.01); *G01C 21/183* (2020.08); *B81B 2201/0242* (2013.01); *E21B 47/13* (2020.05)

(56) References Cited

U.S. PATENT DOCUMENTS

| | | | |
|---|---|---|---|
| 2004/0055380 A1* | 3/2004 | Shcheglov | G01C 19/5684 73/504.12 |
| 2007/0017287 A1* | 1/2007 | Kubena | G01C 19/5684 73/504.02 |
| 2013/0249109 A1* | 9/2013 | Ma | H01L 23/481 257/774 |
| 2016/0016309 A1* | 1/2016 | Swift | B25J 9/0006 623/24 |

* cited by examiner

HIGH-TEMPERATURE SOLID STATE RESONANT GYROSCOPE AND DRILLING MEASUREMENT SYSTEM COMPOSED THEREBY

TECHNICAL FIELD

The present disclosure relates to the technical field of underground azimuth measurement while drilling, and in particular to a high-temperature solid-state resonant gyroscope and a drilling measurement system composed thereby.

BACKGROUND

An MWD (Measurement while Drilling) tool, as one of the most important guiding drilling instruments, has developed rapidly and successfully applied in the past 30 years. Due to the technical breakthrough of the combination of a quartz flexible accelerometer and a fluxgate in the field of oil and gas resources development and application, especially its adaptability to the harsh environment of high temperature and vibration downhole and its accuracy guarantee in this harsh environment, the quartz flexible accelerometer and fluxgate have become the standard configuration of guiding drilling, and their application scope covers vertical wells, large inclination angles and horizontal wells. The geomagnetic north direction is measured by fluxgate measurement, and the well trajectory azimuth is measured. The well inclination angle and the tool face angle of any point on the well trajectory are measured by the combination of the fluxgate and the quartz flexible accelerometer, thus realizing attitude and azimuth measurement of the drill collar under the fixed-point and continuous operation state. The combination of these two sensors defines the specification requirements of MWD to some extent, especially on the premise of ensuring accuracy, taking into account the reliability and life under vibration and impact.

In the U.S. Pat. No. 6,453,239B1, Schlumberger company introduced in detail the design solution based on a hemispherical gyroscope measurement (while drilling) system, which consists of a triaxial hemispherical gyroscope and a triaxial quartz flexible accelerometer, in which the gyroscope adopts the "two-component" structure solution (see FIG. 2(b)), and the resonator adopts the inclined installation mode of 42°. The triaxial gyroscope is installed at a 120-degree inclination angle, which ensures the axial outer diameter of the gyroscope. This patent makes full use of the advantages of a hemispherical gyroscope, such as high accuracy and strong environmental adaptability, and designs a variety of application scenarios, including multi-point gyro compass measurement while drilling, multi-point gyro compass cable measurement, continuous navigation measurement with zero-speed correction capability, continuous cable measurement based on cable length correction, etc. This patent applies a Coriolis vibratory gyroscope to the measurement while drilling system. However, in this patent, the existing problems include but are not limited to:

A fused quartz hemisphere gyroscope is expensive and difficult to process; in a capacitance detection and feedback method, a large voltage (such as the reported 300V voltage) is needed to realize the force balance mode; realization of stability and environmental adaptability in a high-temperature application environment; and greater power consumption.

At present, with the gradual extension of the world exploration field to complex areas and special environments, the development difficulty and cost will greatly increase. The exploration and development situation promotes the evolution and development of well types, and the proportion of complex-structure wells such as extended reach wells, ultra-thin oil layer horizontal wells and multi-branch wells in oil and gas field exploration and development is increasing. With the development of steerable drilling technology represented by rotary steerable technology, especially in deep and ultra-deep steerable drilling applications, the requirements for well trajectory control accuracy are constantly improving, and the existing attitude measurement techniques are faced with the following problems and challenges:

1) Magnetic field interference: a MWD system based on a magnetic sensor uses a magnetic sensor to measure the earth's magnetic field to calculate the azimuth angle, and during the measurement, the magnetic interference from the stratum orebody, drill pipe, solar wind and magnetic storm will have an impact on the measurement of the earth's magnetic field 2) Near-bit measurement problem: due to the magnetic interference of the drill bit and the limitation of the length of a nonmagnetic drill collar, the existing MWD attitude measurement system cannot be installed directly near the drill bit, generally at least 10-15 m away from the drill bit, which means that the current attitude of the drill bit and the converted position information can only be obtained after drilling for 10-15 m, therefore, if the well trajectory has deviated from the original design, it will cost a lot to correct it after discovery, especially for hard stratum trajectory correction with a slow drilling speed.

3) Azimuth measurement of rotary steerable tools: rotary steerable near bit azimuth measurement has always been an important research direction in this field; relatively speaking, due to the direct fixation to a near bit position, a high temperature, large impact, strong vibration and other harsh environments make this kind of application have the most challenging requirements for the comprehensive performance of the gyroscope.

4) Casing windowing in cable measurement mode: positioning windowing in a casing is an early application of a gyroscope in the oil drilling field, mainly for cluster wells. In the process of directional drilling of horizontal wells, a cable gyroscope inclinometer is usually used to complete windowing positioning, thus avoiding "trial and error" windowing and saving time and cost, but the time and cost of cable measurement cannot be ignored; in addition, after the casing is opened, it is still in the magnetic interference environment for a period of time, and the azimuth measurement at this time is still in the "blind zone" of the fluxgate, which requires the gyroscope to realize accurate azimuth measurement before the fluxgate works effectively. The cable measurement mode cannot solve this kind of application efficiently.

5) Requirements for high-end gyroscopes in petroleum exploration and development: gyroscopes applicable for a high temperature and strong vibration and having a small volume and high accuracy can work normally under the standard constructed by the MWD.

SUMMARY

According to the present disclosure, a solid-state gyroscope technology of a HT-CVG (a high-temperature Coriolis vibratory gyroscope) is combined with the application of deep-ultra deep steerable drilling, and a Gyro Measurement while Drilling (GMD for short) is proposed, which realizes the integrated design of a system level, a sensor level and a component level, and meets the application requirements of directional well measurement, rotary steerable systems and the like.

According to the first aspect of the present disclosure, provided is a high-temperature miniaturized resonant gyroscope, including a resonator, a circuit board, a piezoelectric element, a supporting base, a shell and a binding post, wherein the resonator is arranged in the shell and connected with the supporting base, the piezoelectric element is connected with the binding post through a metal conductor, and the circuit board realizes signal transmission, wherein key process points of elements of the gyroscope are fixedly connected by high-temperature materials and high-temperature processes.

Furthermore, the gyroscope is a small-sized gyroscope capable of working at a high temperature of 125° C. or above.

Furthermore, the gyroscope is capable of working at a high temperature of 185° C.

Furthermore, key process points that are fixedly connected include fixedly connected points between the piezoelectric element and the resonator, between the binding post and the piezoelectric element, between the binding post and the circuit board, between the supporting base and the resonator and between the shell and the supporting base.

Furthermore, the welding points are provided on the top of a shell of the resonator, and welding and sealing are realized by using high-temperature materials.

Furthermore, the high-temperature materials include Sn—Ag, Sn—Cu or Sn—Ag—Cu alloys.

Furthermore, a diameter of the gyroscope is not more than 30 mm.

Furthermore, the supporting base of the gyroscope is fixedly connected with the resonator, and the bottom of the supporting base is designed to have a conical shape and is fixedly connected with an external structure through a pressing block.

Furthermore, the external structure is an Inertial Measurement Unit (IMU).

Furthermore, the resonator further includes a transition circuit board, a plurality of round holes are provided on the top of the resonator, and the metal conductor is fixedly connected with the binding post through the round holes.

Furthermore, the piezoelectric element is provided on the sidewall or at the bottom of the resonator.

Furthermore, the resonator adopts a fully symmetrical structure, which includes a supporting column and a fully symmetrical shell, wherein the supporting base includes a bottom and an annular supporting part, the supporting column is located inside the annular supporting part of the supporting base, and the fully symmetrical shell is located outside the annular supporting part of the supporting base, and the fully symmetrical shell adopts a structural form of an equal inner diameter and unequal outer diameters.

Furthermore, the circuit board is located below the supporting base.

Furthermore, a high temperature damper is arranged on the periphery of the gyroscope.

Furthermore, the supporting base and the high temperature damper are fixedly connected into an IMU.

According to the second aspect of the present disclosure, provided is an inertial navigation system, including a triaxial gyroscope, a triaxial accelerometer and a damper, the gyroscope being fixedly connected with the damper, wherein the gyroscope adopts the high-temperature miniaturized resonant gyroscope according to the first aspect of the present disclosure.

Furthermore, the accelerometer is a high-temperature quartz flexible accelerometer or a high-temperature Micro-Electro-Mechanical System (MEMS) accelerometer.

Furthermore, the inertial navigation system also includes a sensor sensitive to geomagnetism.

According to the third aspect of the present disclosure, provided is a drilling measurement system, including the inertial navigation system according to the second aspect of the present disclosure, wherein the measurement system further includes:

a combination of other sensor units, including a temperature sensor and an angle sensor;

a signal acquisition and processing unit configured to acquire intermediate control variables from the inertial navigation system, the combination of other sensor units and a control and calibration unit, and complete signal processing and parameter compensation in the processing unit;

the control and calibration unit configured to control and calibrate rotation of positions of the gyroscope and the measuring system, including but not limited to a gyro closed-loop control and calibration circuit and a rotation-modulated control circuit;

a state monitoring unit and a GMD output unit, wherein the state monitoring unit processes signals from a vibration monitoring sensor or an accelerometer; the GMD output unit includes an MWD standard interface, which is used to output processed signals of the signal acquisition and processing unit;

a power supply unit configured to supply power to the inertial navigation system, the combination of other sensor units, the signal acquisition and processing unit, the control and calibration unit, the state monitoring unit and the GMD output unit; and a shell structure configured to accommodate the inertial navigation system and the units.

Furthermore, the system also includes a rotating unit for driving the measuring system to rotate.

Furthermore, the signal processing is performed in an ARM core processor or other core processors, including but not limited to a full parameter compensation module, a self-correction and self-calibration module, an initial alignment module, a continuous measurement while drilling module and a filter module.

According to the fourth aspect of the present disclosure, provided is a drilling measurement method used in the measurement system according to the third aspect of the present disclosure, comprising the following steps:

S1) judging whether a drill collar is static after receiving a ground drilling stop instruction by the measuring system, if so, starting coarse alignment at a first position, and if not, continuing to wait;

S2) finishing the coarse alignment, and taking information about an azimuth angle, a well inclination angle and a tool face angle output by the measuring system at the end of the coarse alignment as new coordinate vectors;

S3) entering a fine alignment process, and estimating new information about the azimuth angle, the well inclination angle and the tool face angle according to an observed quantity of velocity and an observed quantity of earth rotation angle rate;

S4) starting to rotate the position of the measuring system and acquiring output of an angle sensor in real time;

S5) entering a fine alignment process at a second position, and estimating new information about the azimuth angle, the well inclination angle and the tool face angle by using a velocity vector and the observed quantity of velocity, an earth rotation angle rate vector and the observed quantity of earth rotation angle rate;

S6) finally calculating the azimuth angle, the well inclination angle and the tool face angle according to the information of the azimuth angle, the well inclination angle and the tool face angle of a first position and the second position, estimating bias errors of the gyroscope and the accelerometer, and feeding the bias errors back to an output model of an inertial sensor for correction; and S7) updating the errors and storing data after the alignment is finished.

Furthermore, in step S1), when an external instruction obtains a stop drilling instruction, firstly, the magnitude of mud vibration is judged according to an output signal filtered by the vibration monitoring sensor acquired by the state monitoring unit or an output signal of the accelerometer in the inertial navigation system, and whether to start coarse alignment is judged by a set threshold.

Furthermore, the coarse alignment refers to directly using output information of the gyroscope installed on a carrier and output information of the accelerometer to obtain the information about the azimuth angle, the well inclination angle and the tool face angle of the carrier by an analytical method.

The present disclosure has the following beneficial effects:

according to the high-temperature resonant gyroscope provided by the present disclosure, on the basis of the existing metal resonant gyroscopes, by studying and optimizing the material characteristic, assembly process, structural design, integrated vibration reduction process and the like of its core components, high-temperature resistant materials and processes are adopted, and vibration reduction design is carried out, so that the high-temperature resonant gyroscope applicable for a strong vibration environment can work at a high-temperature environment (125° C. or above);

the present disclosure also provides a miniaturized high-temperature resonant gyroscope, which is designed to be similar to a conical shape, can be directly fixedly connected in an external pressing block manner, which avoids flange or screw installation, saves installation space, and can greatly reduce the volume; and according to the inertial navigation system provided by the present disclosure, the structure is optimized, and the inertial navigation system not only can satisfy a high temperature and strong vibration, but also has the advantage of a small volume.

According to the drilling measurement system provided by the present disclosure, the drilling measurement system has the environmental adaptability under a high temperature, strong vibration and large impact, and in addition, the accuracy under the above environment is guaranteed; the trend of oil drilling is slim hole drilling, so the size of the gyroscope provided in the present disclosure can also meet its stringent requirements.

According to the drilling measurement method provided by the present disclosure, the method is used in the measurement system and can accurately measure the azimuth.

BRIEF DESCRIPTION OF THE DRAWINGS

In order to explain the embodiments of the present disclosure or the technical solution in the prior art more clearly, the drawings required in the embodiments or the description of the prior art will be briefly introduced below. Obviously, the drawings in the following description are only some embodiments of the present disclosure, and other drawings can be obtained according to the structures shown in these drawings without paying creative efforts for a person skilled in the art.

FIGS. 2A-2B are structural schematic diagrams of a hemispherical gyroscope in the prior art, in which: FIG. 2A is a structural schematic diagram of a "three-component" hemispherical gyroscope, and FIG. 2B is a structural schematic diagram of a "two-component" hemispherical gyroscope;

DETAILED DESCRIPTION OF THE DRAWINGS

Exemplary embodiments will be described in detail herein, and the examples thereof are shown in the accompanying drawings. When the following description refers to the drawings, unless otherwise indicated, the same numbers in different drawings refer to the same or similar elements. The implementations described in the following exemplary embodiments do not represent all implementations consistent with the present disclosure. Rather, they are merely examples of devices and methods consistent with some aspects of the present disclosure as detailed in the appended claims.

Figure 1:
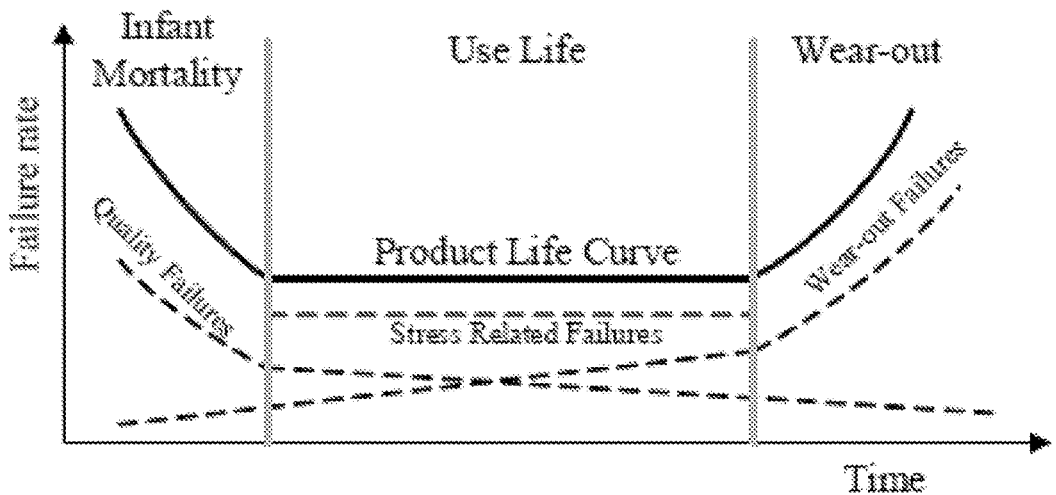
FIG. 1 is a "bathtub" curve of reliability design in the prior art.

FIG. 1 is a classic bathtub curve of reliability design, which is a mathematical model based on an exponential function. The failure time is divided into an early failure period, an occasional failure period and a wear failure period. The early failure period refers to the early failure of products, which is mainly caused by factors such as process defects. A series of tests conducted before the products leave the factory, such as vibration, shock, temperature cycle, multiple power-on and power-off, etc., are aimed at eliminating the early failure of gyroscopes as soon as possible, so that the products delivered to users have already entered a stable accidental failure period. The lifetime or MTBF of a GMD (gyro measurement while drilling) gyroscope refers to the accidental failure period, that is, the region where the slope of the curve is fixed, and the MTBF of the product in the accidental failure period can be defined as:

$$\text{MTBF} = T/R \quad (1)$$

in which T refers to the total working time and R refers to the number of failed parts. Then, in the working period t, the probability of survival of a specific product is:

$$P(t) = e^{-t/MTBF} \quad (2)$$

Viewing form the development history of the gyroscopes, from the initial float gyroscopes to the dynamically tuned gyroscopes, and the later developed optical gyroscopes (laser gyroscopes and fiber optic gyroscopes), to today's Coriolis vibratory gyroscopes, the number of components of a gyroscope is getting smaller and smaller, which on one hand reduces the manufacturing cost of the gyroscope, and on the other hand greatly improves the MTBF of the gyroscope, which is very important for GMD application. The small volume, high accuracy, high reliability and low cost are the basic requirements of the GMD application. From this point of view, the Coriolis vibratory gyroscope represented by the solid-state resonant gyroscope is the most preferred technical solution for the GMD application at present.

In the aforementioned U.S. Pat. No. 6,453,239B1, Schlumberger company introduced in detail the design solution of a measurement (while drilling) system based on a hemispherical gyroscope, which consists of a triaxial hemispherical gyroscope and a triaxial quartz flexible accelerometer, in which the gyroscope adopts the "two-component" structure solution, the resonator adopts the 42° inclined installation mode, and the triaxial gyroscope adopts the 120-degree inclined installation mode.

Among them, the commonly used materials of the resonator of the resonant gyroscope include isotropic fused quartz, elastic alloy, silicon (MEMS), etc. The commonly used shapes are hemispherical, cylindrical, annular, dish-shaped, etc. The thin-shell resonator has a thin wall and is easy to deform, and the resonant frequency of the resonator determined by its materials and shape is repeated and stable. There are three most common operating modes of the resonator: n=0 mode, in which the resonator vibrates in tension and compression; n=1 mode, in which the vibration shape of the resonator does translational displacement; and n=2 bending vibration mode. Among them, n=2 mode is the most stable mode, and it is generally selected as the vibration shape of the resonator.

When the resonator is excited, the vibration shape is in the form of standing wave. When the resonator has no angular velocity input, the antinode is located on the four axes of the symmetrical resonator. When the resonator rotates around the symmetry axis at an angular rate $\Omega$, the antinode axis (standing wave) will be caused to rotate (precession) relative to the resonator in an inertial space under the action of the Coriolis inertial force.

Under the action of the inertial force, there is a fixed lag between the four-antinode precession angle $\Phi_1$ of the resonator vibration and the physical rotation angle Do of the resonator, that is, $\Phi_1 = \kappa \Phi_0$, $\kappa$ is called the Bryan factor, and its value is only related to the materials and shape of the resonator. The azimuth angle of the four-antinode vibration shape is detected in real time by picking up electrodes, and then the rotation angle of the gyroscope is calculated according to the vibration shape precession angle. This mode is called a full-angle operation mode. By applying feedback control to suppress the precession of the resonator, the four-antinode vibration shape can overcome the Coriolis force and keep suppression with the shell all the time. The input angular rate is calculated by applying a feedback force, which is called a deep negative feedback mode or a rate mode.

Figure 2A:
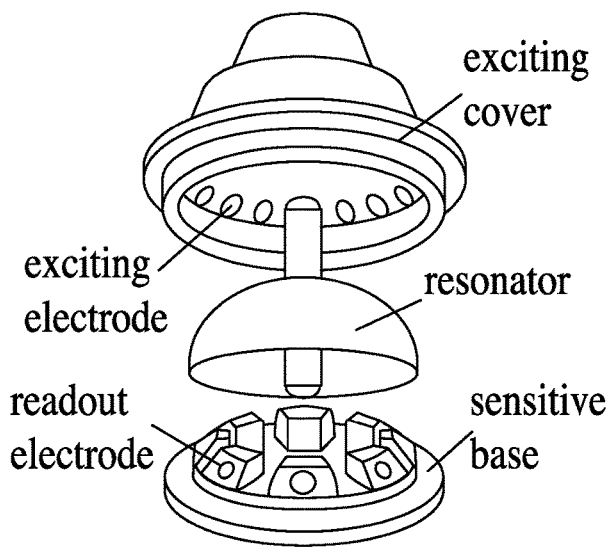
Figure 2B:
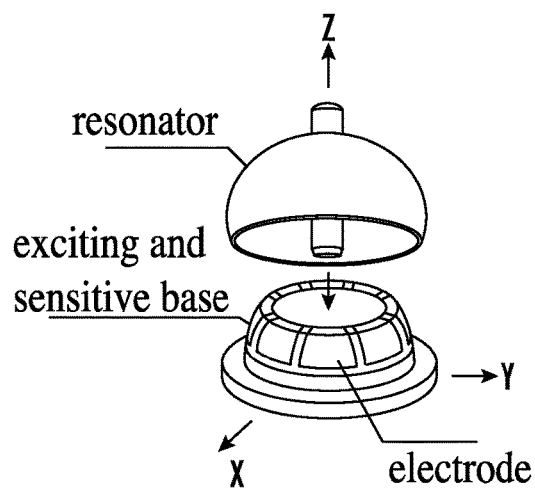

As shown in FIG. 2, it is a commonly used hemispherical gyroscope structure, and FIG. 2(a) is a schematic structural diagram of a "three-component" hemispherical gyroscope, the core components of which are a driving electrode, a resonator and a measuring electrode; FIG. 2(b) is a schematic structural diagram of a "two-component" hemispherical gyroscope, namely, the core components are driving and detecting multiplexing electrodes and a resonator.

Figure 3:
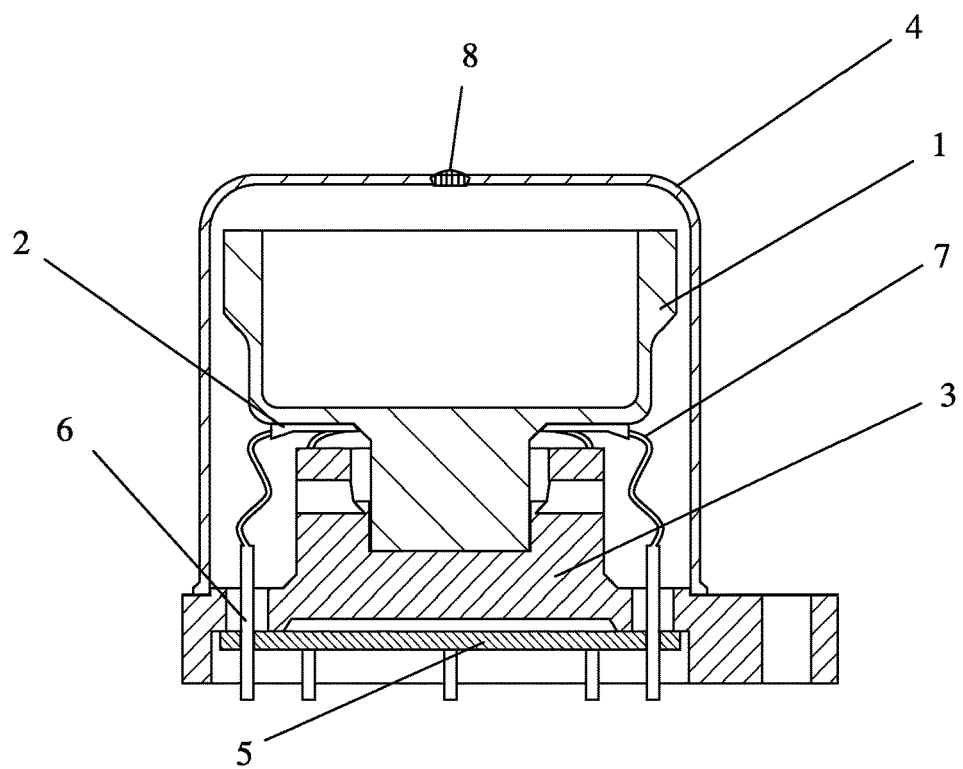
FIG. 3 is a schematic structural diagram of a HT-CVG according to Embodiment 1 of the present disclosure.
Figure 4:
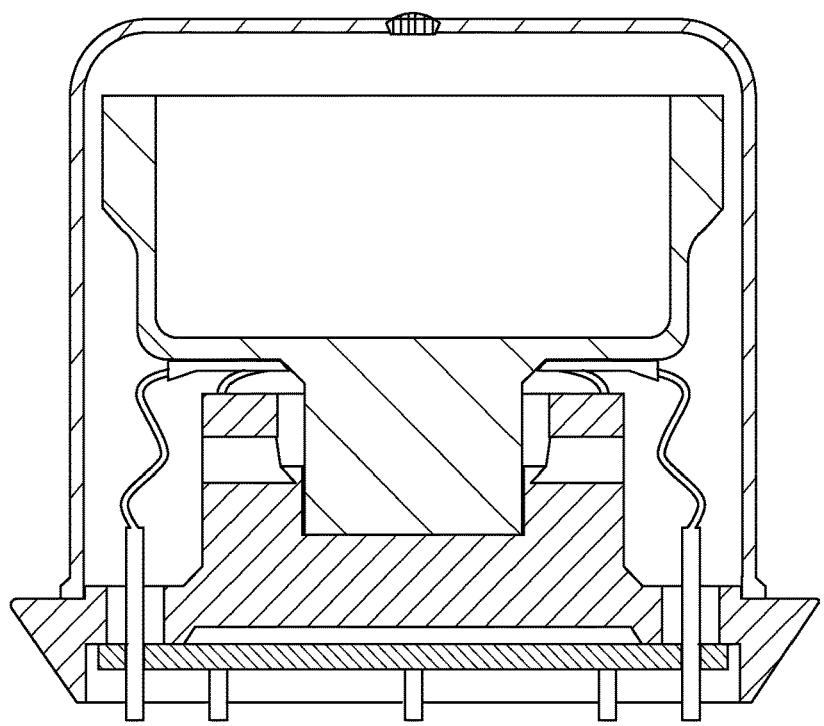
FIG. 4 is a schematic structural diagram of a HT-CVG according to Embodiment 2 of the present disclosure.
Figure 5:
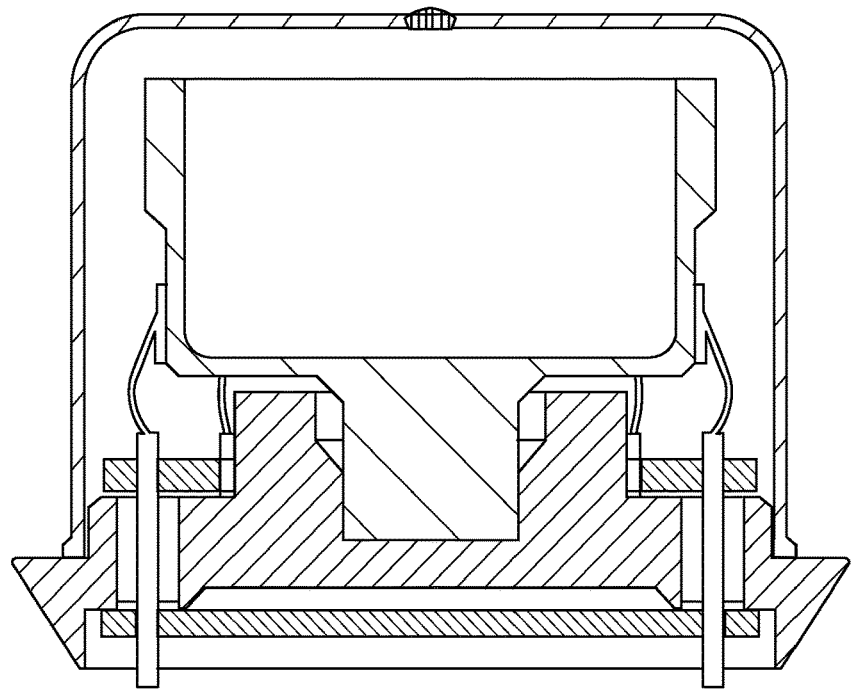
FIG. 5 is a schematic structural diagram of a HT-CVG according to Embodiment 3 of the present disclosure.
Figure 6:
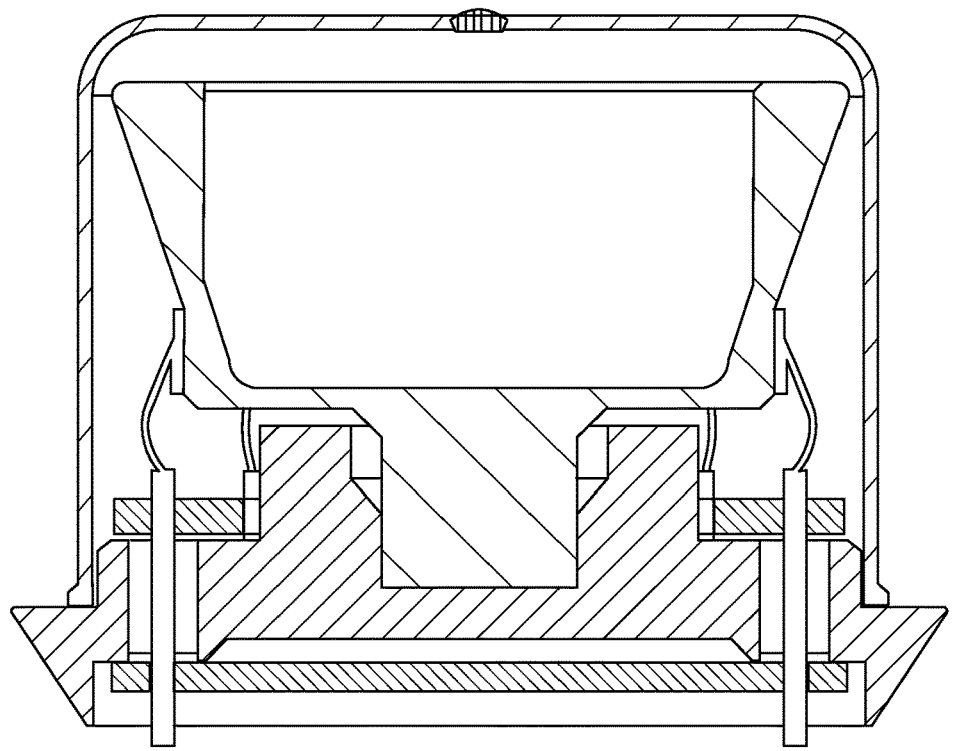
FIG. 6 is a schematic structural diagram of a HT-CVG according to Embodiment 4 of the present disclosure.

A high-temperature HT-CVG (High Temperature Coriolis Vibrating Gyroscope) adopted in the present disclosure is also a vibrating gyroscope based on the Coriolis effect, and adopts a "contact type" electrode configuration solution, which is different from the non-contact electrode configuration of a spherical electrode or a plate electrode, and piezoelectric ceramic (PZT) has higher excitation efficiency and lower requirements for alignment and assembly. As shown in FIG. 3, it is a structural schematic diagram of a HT-CVG. The high-temperature CVG (HT-CVG for short) mainly includes a resonator 1, a piezoelectric ceramic (PZT) 2, a supporting base 3, a shell 4, a circuit board 5, a binding post 6, a conductive metal wire 7 and a welding and sealing material 8. Among them, the binding post 6 is divided into an internal binding post and an external binding post, the internal binding post refers to the binding post fixedly connected with the piezoelectric ceramic through the metal wire, and the external binding post refers to the binding post electrically connected with the circuit board and led out to the outside.

Figure 8:
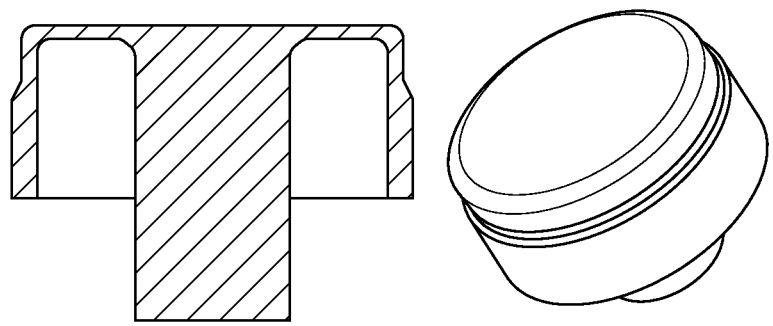
FIG. 8 is a first schematic diagram of the structure of a resonator of the present disclosure.
Figure 9:
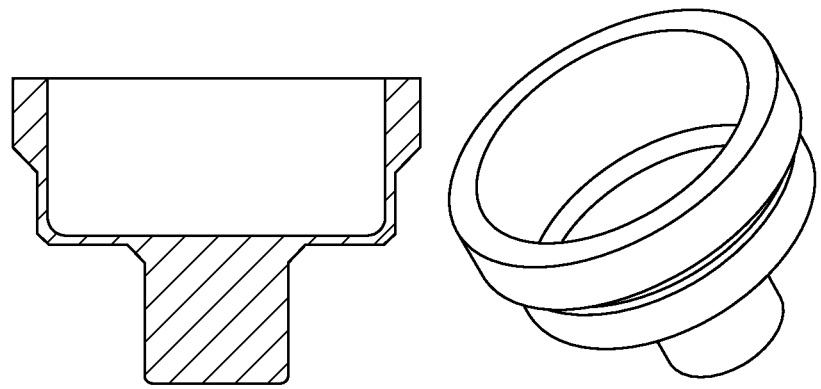
FIG. 9 is a second schematic diagram of the structure of a resonator of the present disclosure.
Figure 10:
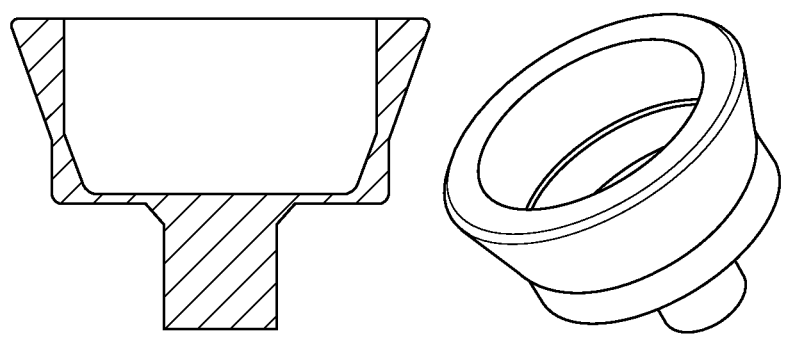
FIG. 10 is a third schematic diagram of the structure of a resonator of the present disclosure.
Figure 11:
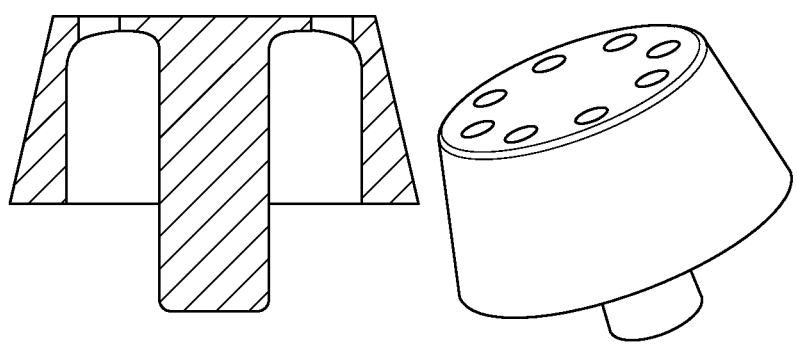
FIG. 11 is a fourth schematic diagram of the structure of a resonator of the present disclosure.

Among them, the resonator can adopt a fully symmetric structure, such as a cylinder, a hemisphere, and a combination of related symmetric structures, such as cylinders with different diameters; the fully symmetrical resonator includes a supporting column and a fully symmetrical shell, wherein the supporting column is located inside the annular supporting part of the supporting base 3, and the fully symmetrical shell is located outside the annular supporting part of the supporting base 3, and the fully symmetrical shell can adopt a structural form of an equal inner diameter and unequal outer diameters (which can improve the signal-to-noise ratio of the resonator); referring to FIGS. 8-11, the structures of various resonators are shown, in which the fully symmetrical shell of the resonator in FIG. 8 is a cylinder with unequal diameters, and the supporting column is inside the cylindrical fully symmetrical shell; FIG. 9 shows that the fully symmetrical shell of the resonator is a cylinder with unequal diameters, and the supporting column is at the top of the cylindrical fully symmetrical shell with unequal diameters. FIG. 10 shows that the fully symmetrical shell of the resonator is a cylinder with a variable diameter, and the supporting column is on the top of the cylindrical fully symmetrical shell with a variable diameter. In FIG. 11, the supporting column of the resonator is inside the cylindrical core, and the resonator is provided with a plurality of lead holes 1102.

Among them, the piezoelectric ceramic 2 can be arranged on the side wall or bottom of the fully symmetrical shell (when the resonator is inverted, it is called "top", which is consistent here and does not affect the feature description), and the supporting base 3 includes a bottom and a supporting part.

In the first to fourth embodiments (see FIG. 3-FIG. 6), the supporting part is annular and arranged above the bottom; in the fifth embodiment (see FIG. 7), the top of the annular supporting part is provided with an annular transition circuit board 705; the fully symmetrical resonator structure is fixed on and matched with the upper part of the supporting base, and the fully symmetrical resonator includes a fully symmetrical shell and a supporting column. As an embodiment, a conductive metal wire (line) is fixedly connected with a binding post through a round hole (e.g., hole 702-1 or 702-2) at the top of the resonator, and a transition circuit board 705 is added between the resonator and the supporting base in this embodiment; a silk screen layer can be designed inside the transition circuit board to realize the interconnection of internal signals. Preferably, eight piezoelectric ceramic electrodes are internally electrically connected and integrated, so that four or several of them are led out, and it is unnecessary to lead out eight, thus reducing the process difficulty.

In the first and second embodiments, the piezoelectric ceramic 2 is fixed at the bottom of the fully symmetrical shell of the resonator 1, which forms a lever effect with the cylindrical shell with different outer diameters, thus improving the driving sensitivity; the external part of the resonator is a shell 4, and the shell 4 and the supporting base 3 are sealed therebetween. As an embodiment, laser welding can be used for sealing. In the third and fourth embodiments, the piezoelectric ceramic 2 is located on the side wall of the fully symmetric shell of the resonator 1; among them, the embodiment 4 and embodiment 5 are variable-diameter resonator shells.

In the first to fourth embodiments, the conductive mental wire 7 connects the piezoelectric ceramic 2 and the binding post 6. The circuit board 5 is located below the supporting base 3, and the top of the shell 4 is sealed with a sealing material 8.

In addition, in the first embodiment, the bottom of the supporting base 3 is fixed by screws or flanges.

In the second to fifth embodiments, the bottom of the supporting base adopts a conical design (it is shown in the figure that the bottom of the supporting base is a cone with an inclined edge). At present, small-sized wells have become a trend, which requires that the measuring instruments must have very small dimensions. For example, as MWD dimensions, the current specifications are Φ48 mm and Φ36 mm. For traditional installation through positioning holes or flanges, due to dimension restrictions, the design is similar to the conical shape design. Fixed connected can be realized by an external pressing block mode, thus avoiding flange or screw installation. The installation space is saved, and the volume can be greatly reduced. In the embodiment of the present disclosure, the diameter of the gyroscope can reach 28 mm, which is smaller than the size of the metal resonant gyroscope in the prior art.

Among them, the resonator of the HT-CVG adopts high-Q alloy materials, which have a lower cost than the quartz CVG which uses fused quartz materials as resonator materials; the processing technology of the resonator is a cylindrical structure, which is simple, while the quartz CVG adopts a hemispherical structure, which leads to a complicated operation and certain processing cost.

The HT-CVG adopts a piezoelectric (a low voltage of 5V) excitation and detection mode, which is lower than that of the quartz CVG adopting a capacitance (a high voltage of 300V) excitation and detection mode.

The vacuum encapsulation mode of the HT-CVG is a medium vacuum degree without a getter, while the quartz CVG adopts an extremely high vacuum degree and needs a getter.

Static/dynamic balance in the HT-CVG is realized by grinding for mass removal (a traditional process), while the quartz CVG is realized by plasma (a complex process), which is complicated in operation and has a higher cost.

As shown in Table 1, the typical characteristics of the HT-CVG and quartz HRG are compared. As can be seen, the HT-CVG has more potential in low cost and high reliability.

TABLE 1

Comparison of characteristics of the HT-CVG and quartz HRG

| Typical characteristics | HT-CVG | Quartz CVG (HRG) |
|---|---|---|
| Materials of the resonator | high-Q alloy materials | fused quartz materials |
| Processing technology of the resonator | Cylindrical (simple process) | Hemispherical (complicated process) |
| Excitation and detection mode | piezoelectric (a low voltage of 5 V) | capacitive (a high voltage of 300 V) |
| Vacuum encapsulation | a medium vacuum degree without a getter | an extremely high vacuum degree with a getter |
| Static/dynamic balance | grinding for mass removal (a traditional process) | plasma (a complex process) |

The unbalanced mass error caused by nonuniform materials and machining errors is an important factor affecting the Q value of the resonator, and the energy loss caused by unbalanced mass dm is:

$$dE = E \frac{dm}{m}.$$

The expression of a parasitic quality factor caused by mass imbalance is:

$$\frac{1}{Q_{dm}} = \frac{1}{2\pi} \cdot \frac{E'}{E} = \frac{1}{2\pi} \cdot \frac{dm}{m} \cdot \left( \tan^{-1} \frac{\omega_{dm} \omega_x}{Q_{dm}(\omega_x^2 - \omega_{dm}^2)} \right) \quad (3)$$

in which, $\omega_{dm}$ is the natural vibration frequency of a unbalanced mass, $Q_{dm}$ is its quality factor, $\omega_x$ refers to the natural frequency of the resonator, and E' refers to the energy leakage of the unbalanced mass. It is considered in the prior art that the mass imbalance of $dm/m=10^{-3}$ can reduce the comprehensive quality factor of the resonator by one order of magnitude, thus maintaining the driving energy of the resonator to be improved by one order of magnitude and also increasing the control error by one order of magnitude.

The energy dissipation caused by the non-ideality of materials and machining errors is bidirectional. On one hand, the energy itself is transferred and dissipated through the base, on the other hand, the external energy is easily transferred to the resonator through the base. For an ideal resonator, the full symmetry of the antinode and node offsets and isolates the external energy interference. In an oscillation period, the force or moment acting on the supporting body is zero. When there are non-ideal factors such as mass imbalance, the energy leakage of the resonator is caused, and at the same time, the support cannot completely isolate external vibration. When there is external input vibration interference, an extra force $f_{dm}$ is generated by unbalanced mass coupling, and $f_{dm}$ is a force transferred from external vibration to the resonator:

$$f_{dm} \propto \frac{dm}{M} \gamma_a \quad (4)$$

in which, $\gamma_a$ refers to an external vibration acceleration, so the unbalanced mass dm is the main source of a gyroscope vibration rectification error. As an inertial device used in GMD, in the high temperature vibration environment of the underground, the energy dissipation caused by mass imbalance easily interferes with the resonator from the outside, which is also an important factor that restricts the measurement accuracy of the GMD, especially in a continuous measurement mode.

Therefore, to achieve a higher Q value, it needs to consider the above four factors, among which the material characteristics and stability of the resonator itself are the internal basic factors that determine the quality factor, while the machining accuracy of the resonator is the decisive factor that determines its energy loss. On one hand, the energy loss of the resonator brings a Bias; on the other hand, the stability of energy loss is the key to determine the stability of a Bias Drift, which reduces the energy loss and improves the overall quality factor of the resonator, thus reducing the external control energy requirement for maintaining stable amplitude vibration of the resonator and the error brought by a controller.

In addition to the structural design, the present disclosure aims to provide a high-temperature Coriolis vibratory gyroscope (HT-CVG), which can work at a high temperature of 125° C. or above.

Specifically, on that basis of the existing metal resonant gyroscope, the present disclosure realizes the application of the metal resonant gyroscope at a high temperature by researching and optimizing the material characteristics, assembly process, integrated vibration reduction process and the like of its core components.

According to the present disclosure, the development of a high-temperature gyroscope prototype of a HT-CVG is realized, and a related self-calibration method is researched aiming at the application of the GMD in total well deviation measurement.

In this embodiment, the process of the HT-CVG is reformed, especially the key process points in the HT-CVG and the process points between the HT-CVG and a high-temperature resistant damper.

Among them, the key process points include but are not limited to: a welding joint is arranged between the resonator and the supporting base to realize the fixed connection; a welding joint is arranged between the piezoelectric ceramic and the cylindrical resonator to realize the fixed connection; a welding joint is arranged between the internal binding post and the internal circuit substrate to realize fixed connection; a welding joint is arranged between the supporting base and the internal circuit substrate to realize fixed connection; a welding joint is arranged between the internal binding post and the circuit board to realize the fixed connection; a welding joint is arranged between the external binding post and the circuit board to realize fixed connection; in another embodiment, the above-mentioned fixed connection can be realized by adhesive bonding instead of welding joints.

Furthermore, the top of the shell is provided with welding joints, and the welding is realized by a sealing welding in a vacuum environment. See table 2 for details:

TABLE 2

| Description of parts for interconnection between key process points of a high-temperature header | |
|---|---|
| No. | Description of fixedly interconnected parts |
| 1 | the resonator and the supporting base |
| 2 | the piezoelectric ceramic and the resonator |
| 3 | the internal binding post and the internal circuit substrate |
| 4 | the supporting base and the internal circuit substrate |
| 5 | the internal binding post and the circuit board |
| 6 | the external binding post and the circuit board |
| 7 | The vacuum sealing welding |
| 8 | the high-temperature header and the high-temperature resistant damper |

In this embodiment, by optimizing the process parameters of the high temperature adhesive or the high temperature welding, it is ensured that the components of the resonator and the HT-CVG composed of them can work normally in a high temperature environment.

The welding process of each key component in Table 2 is the basis for determining whether the high-temperature CVG gyroscope can work normally and stably. With respect to the environment requirements such as a high temperature, strong vibration, and large impact, the long-term stability, excellent repeatability, excellent vibration characteristics (low vibration rectification error) and high MTBF (mean time between failures) of the high-temperature CVG gyroscope can be achieved.

Different welding materials are used to realize the interconnection of the above-mentioned key components. High temperature processes also need to be considered. High temperature processes include the selection of welding process parameters. Several factors need to be considered:

1. The melting point of the welding material

Since the CVG gyroscope works in a high temperature environment for a long time, at 4000 meters or even 8000 meters, the temperature can reach 150° C., even 185° C. The traditional welding material has a low melting point, the organization is easy to coarsen at a high temperature, and the mechanical properties are reduced, which cannot meet the requirements of use.

2. The cutting strength of the welding material

Shear strength is the key to determine whether the CVG gyroscope can survive under strong vibration and large impact, especially at a high temperature, the shear strength of the welding material becomes worse.

3. The creep resistance and thermal fatigue resistance of the welding material: it will affect the long-term stability and repeatability of the gyroscope.

The traditional SnPb or 62Sn36Pb2Ag welding material has a low melting point, and the organization is easy to coarsen at a high temperature of 150° C., and the mechanical properties are reduced, which cannot meet the requirements. Moreover, in the prior art, gyroscopes are mostly used in ground or space applications, and only need to meet the high temperature environment of 65° C. or not higher than 85° C., and cannot meet the high temperature environment (especially the temperature of 185° C. or above). In addition, due to the long-term strong vibration and large impact environment in the measurement while drilling mode, the existing technology cannot meet such a harsh application environment.

The welding between the resonator and the base is a metal-to-metal welding. In an embodiment of the present disclosure, an Ag-doped Sn material, such as Sn96.5Ag3.5, has a melting point of 221° C., which is higher than that of the traditional Sn—Pb by 38° C. In addition, the Sn—Ag—Cu alloy produced from the extension of Sn—Ag and Sn—Cu is also a eutectic phase with a melting point of 217° C., and it can also be used as a welding material for the resonator and the base. In another embodiment, the creep resistance of Sn—Ag or Sn—Ag—Cu alloy is also better than that of a traditional welding material, and can be used as a preferred welding material for the resonator and the base.

The embodiment of the present disclosure adopts a contact piezoelectric ceramic drive and measurement solution, which improves the drive efficiency and detection sensitivity; and different from the non-contact electrode configuration of a spherical electrode or a plate electrode, the piezoelectric ceramic (PZT) has higher excitation efficiency, and lower alignment and assembly requirements.

A fully symmetrical (such as cup-shaped, cylindrical) resonator mass is fixedly connected to the supporting base. In one embodiment, the mass is excited by the piezoelectric ceramic to resonate, and a control circuit is used to achieve that a resonator resonates with a stable amplitude and a stable frequency. When there is an external input angular rate, the vibration amplitude of the resonator generates a Coriolis force, which makes the standing wave of the resonator process, thus exciting the modal along the direction of 45°. By detecting the vibration amplitude in this direction, the external input angular rate can be obtained. In order to reduce the energy consumption of the resonator, the resonator is sealed in a vacuum cavity through a shell.

In order to meet the reliability and accuracy of solid-state gyroscopes in high-temperature environments, the above-mentioned piezoelectric ceramics need to be bonded to the surface of the resonator with high-temperature welding adhesive or high-temperature bonding. The resonator and the base are processed and assembled with a high temperature resistant technology. The internal wiring circuit board uses a high temperature resistant PCB or a ceramic substrate; the sealing of the shell and the base adopts a high temperature resistant welding technology, such as a laser welding technology.

Figure 12:
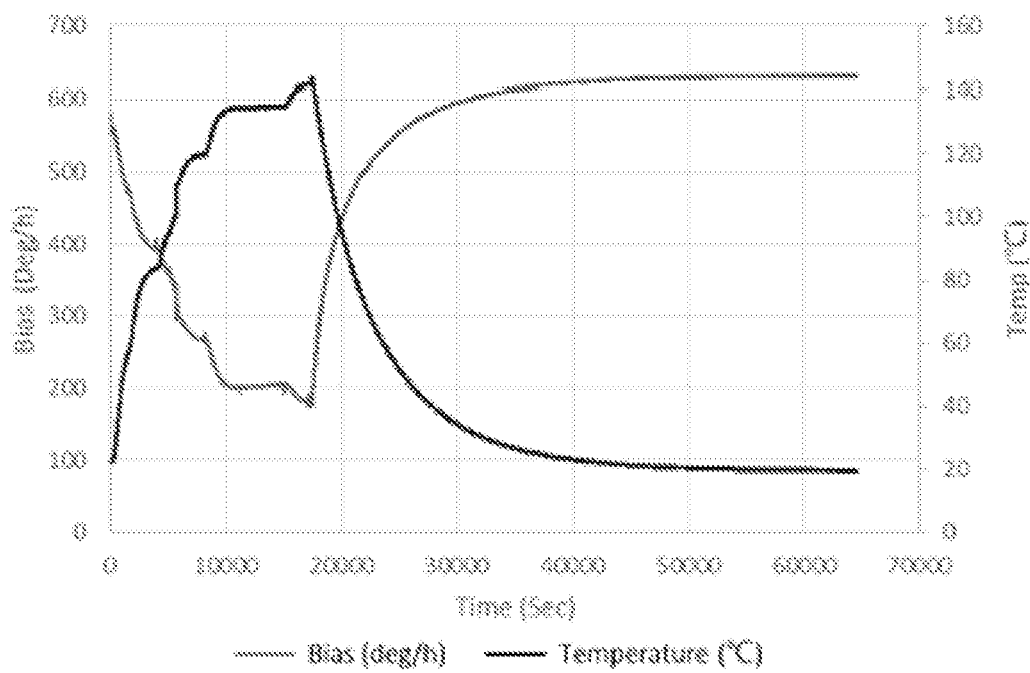
FIG. 12 is an original bias output curve when heating from room temperature to 150° C.

In the test, the gyroscope was placed in a heating device, heated from room temperature to 150° C., and then naturally cooled. The original output of the gyroscope's bias curve during this process is shown in FIG. 12. During the 18-hour sampling process, the gyroscope worked normally.

Figure 13:
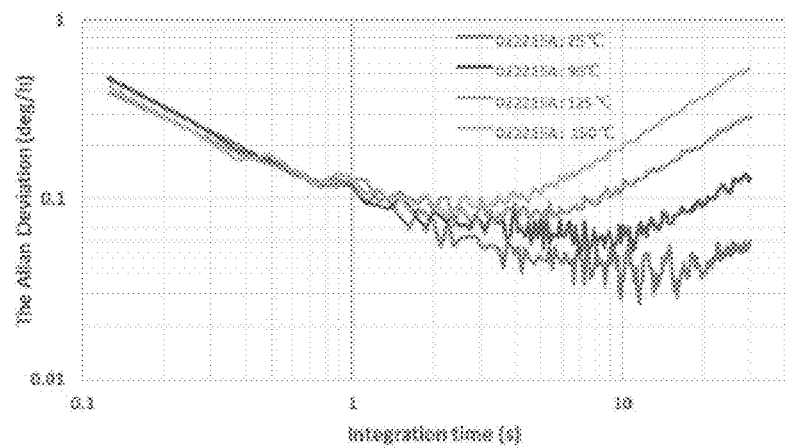
FIG. 13 is an Allan variance test curve of a high-temperature gyroscope (No. 022215A)

Based on this test, fixed-point temperature tests were carried out at the room temperature, 90° C., 125° C. and 150° C., and the temperatures were kept for 1 hour. After the temperatures were stabilized, data were collected at each constant temperature point and the Allan variance was calculated; the gyroscope performance test was performed at 185° C. FIG. 13 shows the test data of the high-temperature gyroscope numbered 022215A. The angle random walk of the gyroscope remains basically unchanged from the room temperature to a high temperature environment of 150° C., and the bias instability parameter increases with the increase of temperature. It is 0.04 deg/h at a normal temperature, and is 0.09 deg/h at a high temperature of 150° C.

Figure 7:
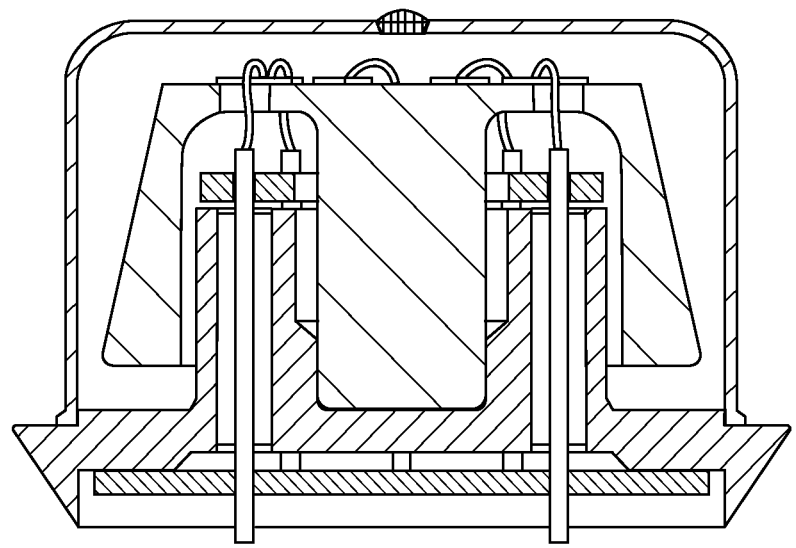
FIG. 7 is a schematic structural diagram of a HT-CVG according to Embodiment 5 of the present disclosure.

Subsequently, a higher temperature test was carried out on another gyroscope numbered 022269B. In the fixed-point temperature test, a high temperature test of 185° C. was added. The Allan variance curve at each temperature point is shown in FIG. 7.

Figure 14:
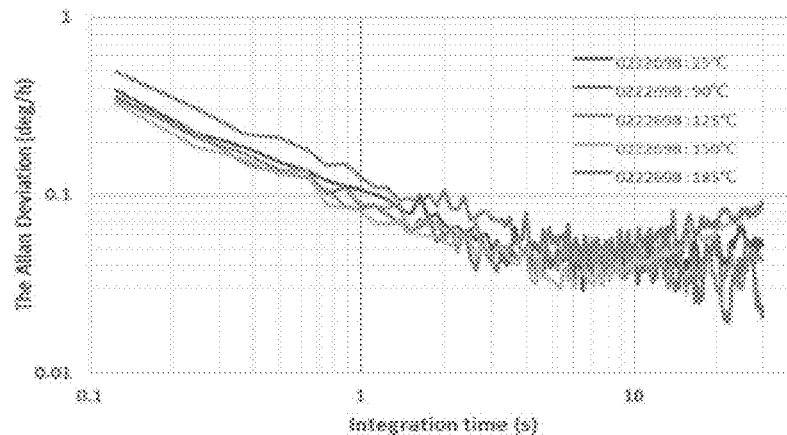
FIG. 14 is an Allan variance test curve of a high-temperature gyroscope (No. 022269B)

It can be seen from FIG. 14 that the angle random walk value of the high temperature gyroscope No. 022269B at each temperature point is basically unchanged. In addition, the parameter distribution of bias instability is relatively concentrated; from the room temperature to a high temperature of 185° C., the bias instability changes from 0.03 deg/h to about 0.05 deg/h, and the drift of the trend item is better suppressed.

The experiment carried out a number of sample tests on high-temperature gyroscopes. From the test data, it can be seen that the angle random walk value does not change at different temperatures from a low temperature to a high temperature, and the ARW value at each temperature point is less than 0.005 deg/$\sqrt{h}$, and the bias instability index becomes worse with the increase of temperature. In general, it is less than 0.1 deg/h at each temperature point.

Figure 15:
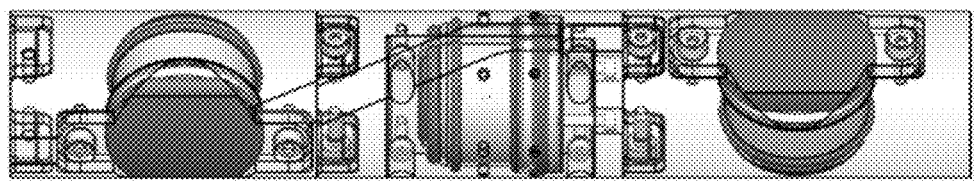
FIG. 15 is a schematic diagram of the installation of a triaxial gyroscope sensing unit.

As shown in FIG. 15, it is the gyroscope setting mode in the GMD of the present disclosure, wherein a triaxial gyroscope with a high-temperature resistant damper is installed in the GMD framework by adopting a triaxial independent detachable design. Preferably, single-axis gyroscopes are set at 90 degrees to one another, taking into account heat dissipation design, vibration characteristics, and convenience for testing and maintenance. In other embodiments, if the triaxial gyroscopes are not set at 90 degrees, the coordinate system can be calculated by a calibration method.

Figure 16:
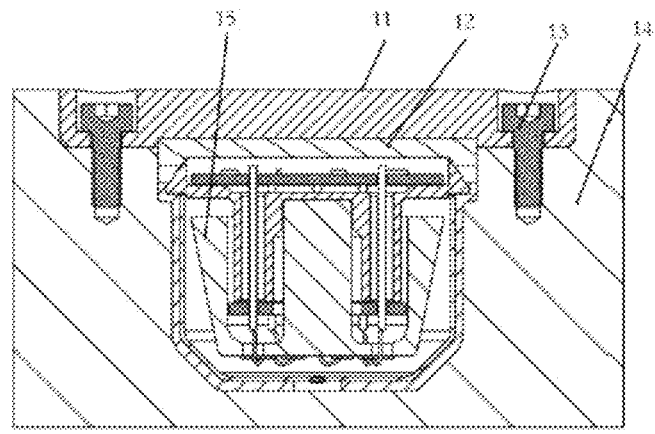
FIG. 16 is a schematic diagram of the installation relationship between a high-temperature sensitive unit and a damper.

FIG. 16 shows the mutual positional relationship between the damper and the gyroscope. In this embodiment, the shape of the gyroscope base is conical, and the base is fixedly connected to the IMU through the damper. In one embodiment, the damper is a high-temperature resistant damper.

Referring to FIG. 16, a resonator 15 and a pressing block 11 are arranged in a probe tube 14, wherein a damper 12 is arranged on the periphery of the resonator 15, and the damper 12 is fixedly connected to the conical exterior of the supporting base of the gyroscope. The gyroscope can be completely enclosed or partially enclosed; the pressing block 11 is connected with the probe tube 14 through a pressing block screw 13.

For Coriolis vibratory gyroscopes, the bias stability and repeatability of the gyroscope under a high temperature and strong vibration are the core factors affecting the accuracy of GMD azimuth measurement, and the non-strict isotropy of the resonator (producing unbalanced mass) is the main factor that produces vibration rectification errors. Because the unbalanced mass of the resonator will cause energy leakage, on one hand, the amplitude of maintaining the energy of the resonator is increased, which brings about control errors; on the other hand, the external vibration interference will affect the normal operation of the resonator, thus resulting in vibration rectification errors. By designing the high-temperature resistant damper of the GMD, the vibration energy exchange between the outside and the resonator is reduced, so as to achieve the purpose of reducing the vibration rectification errors of the gyroscope. The damper and HT-CVG are in a form of a pressing block, the damper is a load-bearing part, thereby attenuating external vibration energy.

In the field of petroleum drilling and directional drilling measurement applications, from the perspective of working principles, the application of gyroscopes is mainly divided into two categories. One is static point measurement, which mainly uses the gyroscope to sense the horizontal component of the ground speed to achieve geographic north measurement, which is called a True North Finder or Gyro-Compass mode; the other is continuous measurement, according to the results of initial alignment (north-finding), standard inertial navigation algorithms are used to measure attitude and azimuth information in real time to fit the well trajectory.

Divided from the perspective of realization modes, it is mainly divided into an MWD mode and the cabled mode. In the MWD mode, the gyroscope assembly is fixedly connected to the drilling tool. When the drilling tool is in a static position (such as when the rotary steerable tool starts to change rods), the gyroscope assembly starts to work. Generally, the north-finding mode is adopted to realize the rapid north azimuth measurement. When the drilling tool is drilling, the gyroscope assembly is in a dormant state at this time, and the gyroscope is drilling together with the drilling tool. Therefore, the gyroscope is guaranteed to survive under the high temperature, strong vibration and large impact, and it can ensure measurement accuracy after the working mode is started; in the cable logging mode, it generally works independently, mainly for cable logging applications, and the efficiency of measuring the well trajectory is low, but at this time, the working environment of the gyroscope is relatively gentle compared with that during measurement while drilling.

In addition, from the perspective of fixed connection modes of the gyroscope, it is divided into a platform type and a strap-down type. In the platform type working mode, the gyroscope is a measuring element in the rate stabilization loop, and the rate stabilization loop establishes the inertial space. Accordingly, the accelerometer or other sensors completes the measurement of the attitude and azimuth relative to the inertial space. In the strap-down mode, the gyroscope and the accelerometer are directly fixedly connected to the measurement tool, and the attitude and azimuth information can be measured through the north finding algorithm or the strap-down algorithm.

All the above application modes, in addition to the gyroscope as the core sensor, need accelerometer components to calculate a tool face angle and a well inclination angle through sensitive earth gravity components. These two key drilling parameters are the premise of calculating an azimuth angle, so the accelerometer and gyroscope are equally important. At present, a quartz flexible accelerometer is commonly used, which is widely used in MWD based on magnetic measurement. In addition, with the continuous improvement of MEMS accelerometer accuracy, a high-temperature MEMS accelerometer has gradually been applied in the fields of low precision, strong vibration and impact.

Figure 17:
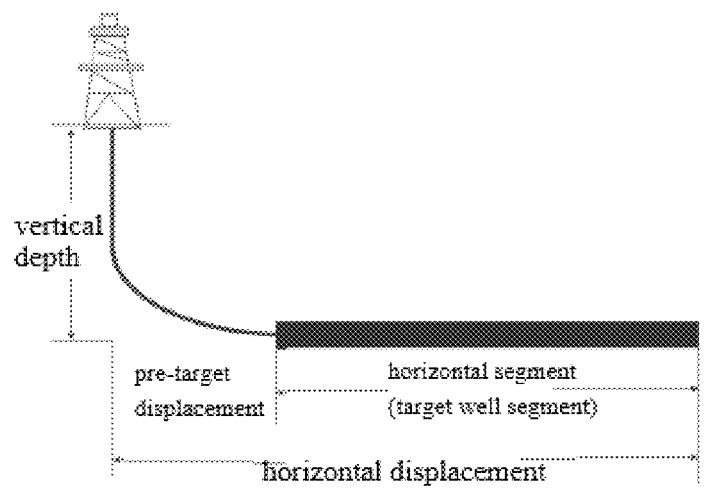
FIG. 17 is a schematic diagram of a directional horizontal well according to the present disclosure.

For directional well survey, especially for horizontal well development as shown in FIG. 17, it is required that the gyroscope not only has high precision, but also has the adaptability to the environment under high temperature, strong vibration and large impact, and in addition, ensures the accuracy under the above environment. In addition, the trend of oil drilling is slim hole drilling, so the size requirement of the gyroscope is particularly strict.

Figure 18:
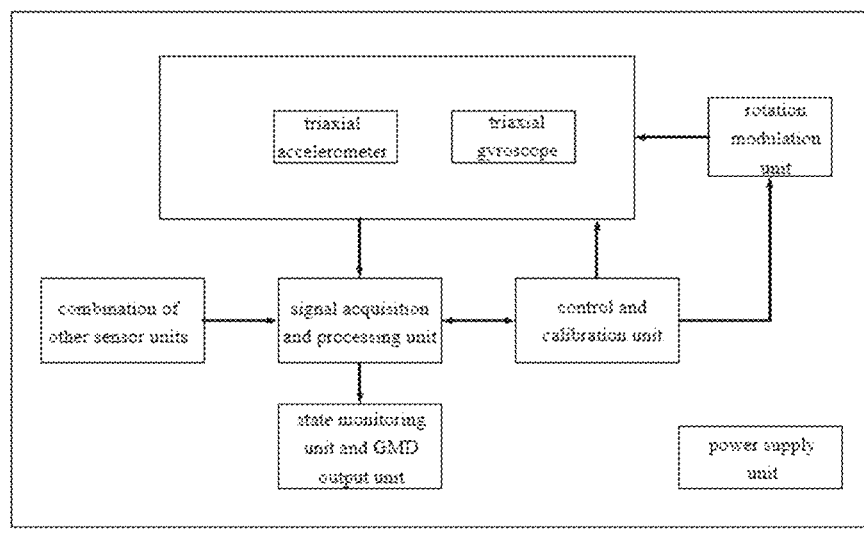
FIG. 18 is a system structure block diagram of the present disclosure.

As shown in FIG. 18, it is an embodiment of the disclosure, illustrating the structure of the directional well drilling azimuth measurement system, in which an inertial navigation unit includes a triaxial high-temperature gyroscope and a triaxial high-temperature accelerometer, which are fixed to the interior of the skeleton structure of the GMD in a strapdown manner by way of orthogonal installation (or non-orthogonal, which requires calibration of an initial installation angle and the corresponding conversion coordinate system), wherein the high-temperature accelerometer can choose two solutions: a high-temperature quartz flexible accelerometer and a high-temperature MEMS accelerometer. In another embodiment, the inertial navigation unit further includes a triaxial high-temperature gyroscope, a triaxial high-temperature accelerometer and a fluxgate.

As shown in FIG. 18, in addition to the inertial navigation unit, the probe structure also includes a shell structure, a combination of other sensor units, a signal acquisition and processing unit, a control and calibration unit, a power supply unit, a state monitoring unit and a GMD output unit.

The shell structure includes a rotating unit, a skeleton and a pressure-resistant pipe; in an embodiment, the rotating unit rotates in two fixed positions, and can also rotate in more positions (four positions).

The combination of other sensor units includes, but is not limited to, a temperature sensor, an angle sensor, etc.

The signal acquisition and processing unit acquires intermediate control variables (as an embodiment, such as the vibration amplitude of the gyroscope, the phase, temperature or like of the gyroscope) from the control and calibration unit, and completes calibration and parameter compensation in the processing unit.

Specifically, the signal acquisition and processing unit includes:

A signal acquisition unit: including acquisition of gyroscope signals, accelerometer signals, sensor signals sensitive to geomagnetism, vibration monitoring signals, temperature signals, angle signals and so on; the signal acquisition and processing unit also includes a signal processing unit, which is implemented in an ARM core processor or other core processors, including but not limited to a full parameter compensation module, a self-adjustment and self-calibration module, an initial alignment module, a continuous measurement while drilling module, a filtering (such as an anti-aliasing filter) module, etc.

The full parameter compensation module is configured to realize parameter compensation through error modeling and related algorithms by collecting a plurality of observation points inside the gyroscope and accelerometer, and specifically includes compensation for drift errors of the gyroscope or accelerometer caused by temperature and vibration.

The self-adjustment and self-calibration module makes full use of the full symmetry characteristics of the high-temperature gyroscope, collects the key monitoring points inside the gyroscope in real time by feeding excitation signals from the outside, calibrates the bias drift error of the gyroscope through an algorithm in the processor, and calibrates the scale factor error of the gyroscope.

The initial alignment module calculates, in case that the GMD is under a static base, the initial values of the azimuth angle, the well inclination angle and the tool face angle usually by a rough alignment algorithm through the gyroscope and accelerometer, respectively, sensitive to the earth rotation angle rate information and gravitational acceleration information, and then calculates, by combing external auxiliary information, such as zero-speed correction information, etc., the azimuth angle, the well inclination angle and the tool face angle of the GMD by the Kalman optimal estimation algorithm.

The continuous measurement while drilling module is configured to output, in real time, the azimuth information and the well inclination angle information, and tool face angle information of the GMD during continuous operation through a related algorithm based on the initial azimuth angle, the well inclination angle and the tool face angle calculated by the initial alignment, and then calculating the well trajectory information.

The filtering module is configured to allow the multi-dimensional sensor signals (signals of the accelerometer, the gyroscope, the magnetic sensor and other sensors) collected in real time to pass through a filter, usually an anti-aliasing filter, and then output to an ADC module in the signal acquisition and processing unit to achieve analog-to-digital conversion.

The control and calibration unit includes, but is not limited to: a gyroscope control and calibration circuit, and a rotation-modulated control circuit, including closed-loop control of the gyroscope; in addition, the control and calibration unit and the signal acquisition and processing unit jointly control the rotating unit to drive the inertial navigation system composed of a triaxial accelerometer and a triaxial gyroscope for rotation modulation (or rotation position) so as to realize the elimination or suppression of the bias errors of the accelerometer and gyroscope.

The rotating unit includes a rotating position drive mechanism.

Among them, the filter module also includes a vibration monitoring filter circuit.

In an embodiment, the vibration monitoring filter circuit is a band-pass circuit, and the cutoff frequencies of −3 dB are 8 Hz and 15 KHz, respectively. When GMD is normal, the working frequency band is a low frequency and close to DC, so the vibration monitoring frequency band is insensitive to signals below 8 Hz. The natural vibration frequency of the gyroscope is close to 8 KHz, the bandwidth of the quartz flexible accelerometer is 100 Hz, and the cut-off frequency of a high frequency band is set to 15 KHz. In the working process of the GMD, because of the large magnitude of impact that may be borne and the wide frequency range of acquisition, an open-loop silicon-based MEMS or a piezo-electric accelerometer are preferred, taking both a large range and a large bandwidth into account.

The power supply unit supplies power for the inertial navigation unit, the signal acquisition and processing unit, the control and calibration unit, the rotating unit, the state monitoring unit, the GMD output unit and combination of other sensor units.

Among the state monitoring unit and the GMD output unit, the state monitoring unit includes a vibration monitoring sensor and performs related algorithm processing on signals of the vibration monitoring sensor or accelerometer; the GMD output unit includes an MWD standard interface, and the signal acquisition and processing unit outputs the result to the GMD output unit.

The measurement system is used in the drilling engineering shown in FIG. 17, for directional drilling of directional wells, measurement of well trajectories, etc. It can be installed in drill collars in a measurement while drilling (MWD) mode, or in a cable logging mode.

Figure 19:
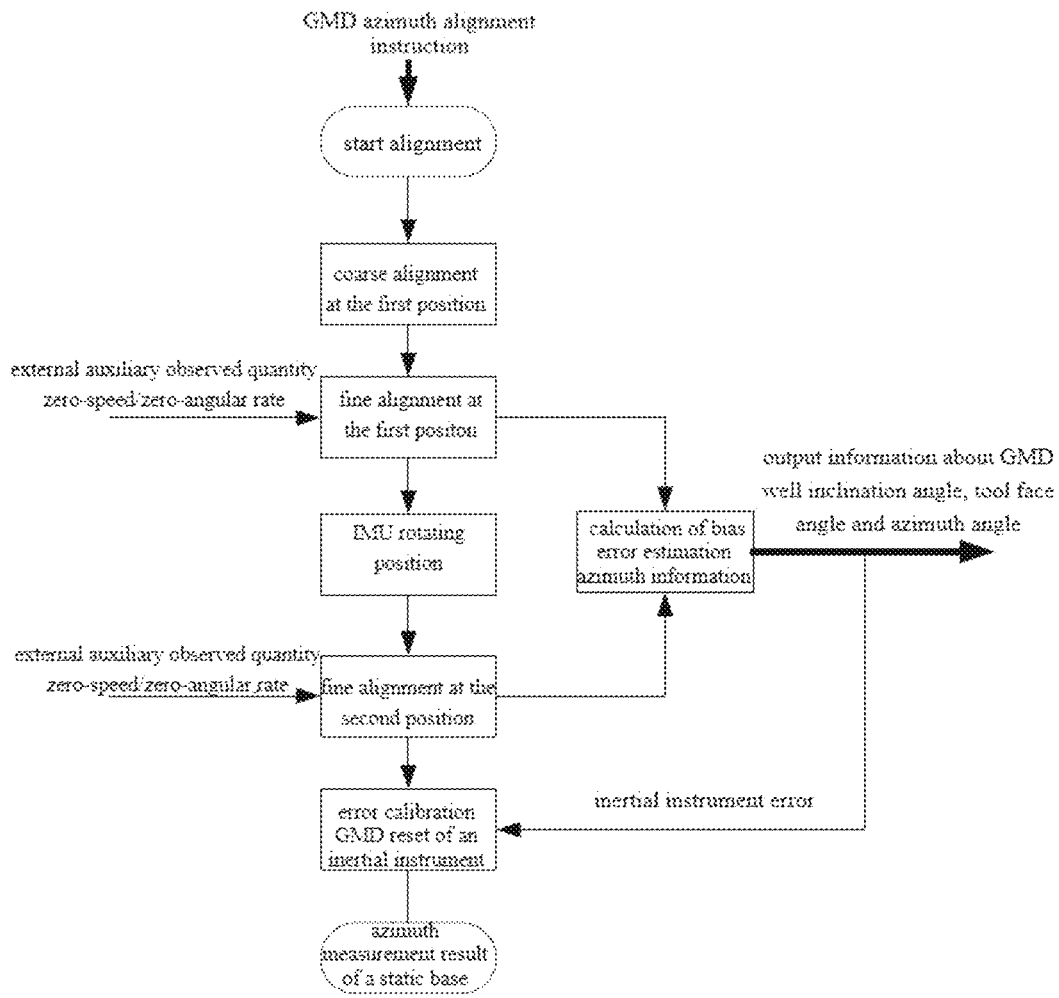
FIG. 19 is a flow chart of the drilling inertial navigation measurement method of the present disclosure.

As an embodiment, in the measurement while drilling (MWD) system application environment, the measurement method of the system is shown in FIG. 19, including the following steps:

1) The measurement system (probe) receives the instruction of stopping drilling from the ground, and the sensor judges whether the drill collar is static or not, so as to avoid interference factors such as a mud pump affecting the measurement accuracy. If so, coarse alignment is started at this position (i.e., the first position); and if not, continue to wait.

When an external instruction is given to stop drilling, firstly, the signals from the vibration monitoring sensor or accelerometer in the "inertial navigation system" after acquisition and filtering are processed by the state monitoring unit to judge the magnitude of mud vibration, and whether to start coarse alignment and whether to start Kalman optimal estimation are judged according to a set threshold.

The initial alignment instruction from outside (e.g., the construction site) is mainly the GMD system-level instruction. At this time, the construction site has made it clear that the drill collar is in the drilling stop state.

The instructions of the accelerometer or the vibration monitoring sensor are interpreted, that is, after receiving the external instructions, they must be interpreted by the state monitoring unit to determine whether there are interference factors down the well, such as mud and other relatively large sloshing, which are output by the filter of the sensor, and the state monitoring unit sets a threshold judgment program, and performs rough alignment when the sloshing value is less than the set value.

The rough alignment refers to directly using output information of the gyroscope installed on the carrier and output information of the accelerometer, and obtaining information about the azimuth angle, well inclination angle and tool face angle of the carrier by an analytical method;

2) Coarse alignment is completed: the information about the azimuth angle, well inclination angle and tool face angle output by the system at the end of coarse alignment are taken as new coordinate vectors.

The system outputs the output calculated by rough alignment.

3) A fine alignment process is entered: the information about the azimuth angle, well inclination angle and tool face angle after data fusion is estimated according to external observation vectors such as the observed quantity of velocity and observed quantity of the earth rotation angle rate through an optimal estimation algorithm such as Kalman algorithm.

4) Position rotation is started, and the output of the angle sensor is collected in real time.

5) The fine alignment process is entered at the second position, and new information about the azimuth angle, well inclination angle and tool face angle is estimated.

6) The accurate azimuth angle, well inclination angle and tool face angle after optimal estimation are finally calculated according to the information about azimuth angle, well inclination angle and tool face angle at the first and second positions, and the bias errors of the gyroscope and accelerometer are estimated and fed back to the output model of the inertial sensor for correction.

7) After the alignment is finished, the errors are updated and the data are stored.

Among the above methods, there are many methods for coarse alignment for strapdown inertial navigation: directly using the components of gravity acceleration and earth rotation angular rate as inputs for solving, and using the Euler angle method (analytical method); or using the attitude matrix method based on the principle of double vector attitude determination, or the inertial system alignment method under a shaking base. No matter which coarse alignment method is adopted, the ultimate limit precision analysis is almost the same, that is, the azimuth alignment accuracy is mainly related to the drift error of the equivalent eastward gyroscope, and the horizontal attitude accuracy depends on the drift error of the accelerometer of the horizontal axis. Different coarse alignment methods only have differences in the ability to suppress external environmental interference and the amount of calculation.

Because the geographical location of the drilling construction site is known, the component of the angular velocity vector of the earth rotation in the geographical coordinate system and the gravity vector can be accurately obtained at this time, as shown by the following equation:

$$\omega_{ie}^k = \begin{bmatrix} 0 \\ \omega_{ie}\cos L \\ \omega_{ie}\sin L \end{bmatrix} = \begin{bmatrix} 0 \\ \omega_N \\ \omega_U \end{bmatrix}, \quad g^u = \begin{bmatrix} 0 \\ 0 \\ -g \end{bmatrix} \quad (5)$$

in which, g, $\omega_{ie}$, and L represent the local gravity acceleration, the earth rotation angular velocity, and the local latitude, respectively. The north component of the earth rotation angular velocity is recorded as $\omega_N = \omega_{ie} \cos L$, and the normal component of rotation angular velocity of the earth is recorded as $\omega_U = \omega_{ie} \sin L$.

In the process of coarse alignment on a static base, the gyroscope and accelerometer in the GMD system respectively measure the projections of the gravity vector and earth rotation angular velocity under the carrier system. The influence of mud sloshing interference is ignored. The measured values of the three-component gyroscope on the carrier and three-component acceleration are as follows:

$$\tilde{\omega}_{ib}^b = \hat{C}_n^b \omega_{ie}^n \quad (6)$$

$$\tilde{f}^b = -\hat{C}_n^b g^n \quad (7)$$

in which, $$\tilde{\omega}_{ib}^b = [\tilde{\omega}_x \ \tilde{\omega}_y \ \tilde{\omega}_z]^T, \tilde{f}^b = [\tilde{f}_x \tilde{f}_y \tilde{f}_z]^T \quad (8)$$

The time for coarse alignment is generally very short, and a smoothed average value within a period of time is usually taken as the measured value of an inertial instrument. When the inertial instrument has no obvious drift error of a trend term, the longer the smoothing time is, the better the accuracy can be obtained. Considering the coarse alignment time and alignment accuracy comprehensively, Allan variance test data can be judged and analyzed according to the length of the smoothing time, and the optimal time for smoothing is the time when Allan variance "bottoms out".

A pitch angle (a well inclination angle) can be calculated according to equations (6) and (7):

$$\hat{\theta} = a\tan2\left(\tilde{f}_y, \sqrt{\tilde{f}_x^2 + \tilde{f}_z^2}\right) \quad (9)$$

A roll angle (a tool face angle) is calculated:

$$\hat{\gamma} = \operatorname{atan} 2(-\tilde{f}_x, \tilde{f}_z)$$

On the basis of $\hat{\theta}$ and $\hat{\gamma}$, the following can be obtained by substituting them into equation (6):

$$\begin{bmatrix} \cos\hat{\gamma} & 0 & \sin\hat{\gamma} \\ \sin\hat{\theta}\sin\hat{\gamma} & \cos\hat{\theta} & -\cos\hat{\gamma}\sin\hat{\theta} \\ -\sin\hat{\gamma}\cos\hat{\theta} & \sin\hat{\theta} & \cos\hat{\gamma}\cos\hat{\theta} \end{bmatrix} \begin{bmatrix} \tilde{\omega}_x \\ \tilde{\omega}_y \\ \tilde{\omega}_z \end{bmatrix} = \begin{bmatrix} -\sin\hat{\psi}\omega_{ie}\cos L \\ \cos\hat{\psi}\omega_{ie}\cos L \\ \omega_{ie}\sin L \end{bmatrix} \quad (11)$$

A heading angle is solved as:

$$\hat{\psi} = \operatorname{atan} 2(\tilde{\omega}_x \cos \hat{\gamma} + \tilde{\omega}_z \sin \hat{\gamma}, \tilde{\omega}_x \sin \hat{\theta} \sin \hat{\gamma} + \tilde{\omega}_y \cos \hat{\theta} - \tilde{\omega}_z \cos \hat{\gamma} \sin \hat{\theta}) \quad (12)$$

Equations (9), (10) and (12) constitute the basic algorithm of the Euler angle coarse alignment. The limit accuracy of the Euler analytical method for static base alignment is analyzed below.

Considering the bias errors of the accelerometer and gyroscope:

$$\nabla^n = C_b^n \nabla^b \ \varepsilon^n = C_b^n \varepsilon^b \quad (13)$$

In equation (13), $\nabla^b$ and $\nabla^n$ respectively represent the bias errors of the accelerometer under a carrier system and a navigation system, and $\varepsilon^b$, $\varepsilon^n$ respectively represent the bias errors of the gyroscope under the carrier system and the navigation system.

When solving the differential of one direction and making the angles of the other two directions zero, the two sides of (9), (10) and (12) are differentiated respectively and the second-order small quantity is ignored to obtain:

$$\phi_E = -\delta\theta = \frac{\cos\theta\nabla_y - \sin\theta\nabla_z}{g} = \frac{\nabla_N}{g} \quad (14)$$

$$\phi_N = -\delta\gamma = \frac{\cos\gamma\nabla_x + \sin\gamma\nabla_y}{g} = \frac{\nabla_E}{g} \quad (15)$$

$$\phi_U = \delta\psi = -\frac{\sin\psi(\varepsilon_y - \delta\theta\omega_U) + \cos\psi(\varepsilon_x + \delta\gamma\omega_U)}{\omega_N} = \frac{-\varepsilon_E + \phi_N\omega_U}{\omega_N} = \frac{\varepsilon_E}{\omega_N} + \frac{\nabla_E}{g}\tan L \quad (16)$$

Equations (14), (15) and (16) determine the limit accuracy of the static base alignment. The attitude alignment accuracy under static base mainly depends on the drift error of the accelerometer in east and north directions, while the azimuth alignment accuracy mainly depends on the drift errors of the gyroscope and accelerometer in east direction.

Figure 20:
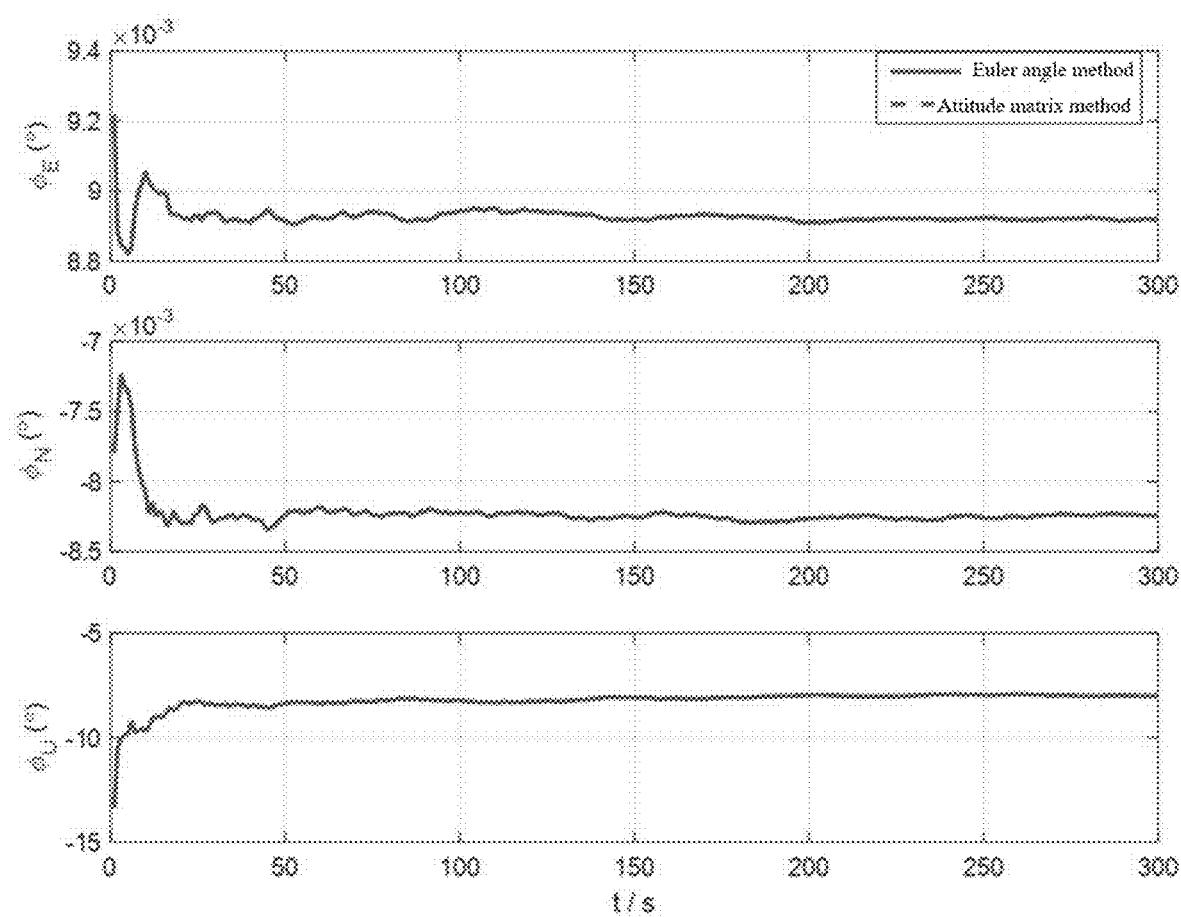
FIG. 20 is a single simulation result diagram of coarse alignment under an environment of a high temperature and strong vibration.

Under the environment of a high temperature and strong vibration, when the repetitive drift errors of the gyroscope and accelerometer in successive start-ups are considered, the single simulation result of coarse alignment is shown in FIG. 20.

In the present disclosure, the model of the inertial instrument and the optimal estimation theory based on Kalman are given:

firstly, the error model of the inertial instrument is given, and under a static base, the scale factor error and installation error are ignored, and the output model of the gyroscope in a carrier coordinate system can be expressed as:

$$\tilde{\omega}^b = \omega^b + \varepsilon_0 + \varepsilon_r + \varepsilon_w \quad (17)$$

in which, $\tilde{\omega}^b$ is the average value of a sampling output of the gyroscope, $\omega^b$ is the true angular rate input value of the gyroscope, $\varepsilon_0$ is the constant drift of the gyroscope, $\varepsilon_r$ is a slow drift and $\varepsilon_w$ is a fast drift.

$\varepsilon_0$ is mainly the repetitive error of successive start-ups, which can be expressed by random constants, and its error model is:

$$\dot{\varepsilon}_0 = 0 \quad (18)$$

The slow drift $\varepsilon_r$ represents the trend term of the gyroscope and represents the rate ramp term in Allan variance, which can usually be described by a first-order Markov process, namely:

$$\tilde{\varepsilon}_y = -\frac{1}{\tau_g}\varepsilon_r + W_r \quad (19)$$

In equation (19), $\tau_g$ is the correlation time of a Markov process, and $w_r$ is white noise.

Through comprehensive error compensation, the trend term error of the gyroscope related to time can be suppressed, which realizes keeping for a long time after the Allan variance of the gyroscope "bottoms out". Therefore, in fact, the Markov correlation time is long and can be ignored in the alignment time, and the output model of the gyroscope can be simplified as:

$$\tilde{\omega}^b = \omega^b + \varepsilon_0 + \varepsilon_w \quad (20)$$

in which, the bias error of the gyroscope is:

$$\varepsilon = \varepsilon_0 + \varepsilon_w \quad (21)$$

Usually, the term $\varepsilon_w$ related to white noise is expressed by the angle random walk coefficient ARW.

Similarly, the output model of the accelerometer can be simplified as:

$$\tilde{f}^b = f^b + \nabla_0 + \nabla_w \quad (22)$$

in which, $\tilde{f}^b$ is the average value of sampling output of the accelerometer, $f^b$ is the real acceleration value of the accelerometer, $\nabla_0$ is the constant drift of the accelerometer and $\nabla_w$ is the random error of white noise.

$\nabla_0$ is mainly the repeatability error of successive start-ups of the accelerometer, which can also be expressed by a random constant, and its error model is:

$$\dot{\nabla}_0 = 0 \quad (23)$$

The bias error of the accelerometer is defined as:

$$\nabla = \nabla_0 + \nabla_w \quad (24)$$

The term $\nabla_w$ related to white noise is usually expressed by a power spectral density (PSD) value within a certain bandwidth of the accelerometer.

The above gyroscope output model and accelerometer output model are collectively referred to as the output model of an inertial instrument.

Fine Alignment Method:

The navigation coordinate system is taken as a northeast geographic coordinate system, and a 12-dimensional fine alignment mathematical model of the inertial navigation system is established. The state variables of a Kalman filter are as follows:

$$X = [(\delta v^n)^T (\phi^n)^T (\varepsilon_0^b)^T (\nabla_0^b)^T]^T \quad (25)$$

In the equation (25): a velocity error $\delta v^n$, a strapdown inertial navigation mathematical platform misalignment angle $\varnothing^n$, a high temperature gyroscope constant drift $\varepsilon_0^b$, and a high temperature accelerometer constant bias and $\nabla_0^b$, $\varepsilon_0^b$ and $\nabla_0^b$ are mainly caused by the repetitive error of successive start-ups of a high-temperature inertial instrument. According to the error model of a strapdown inertial navigation system under a static base and by ignoring small-amount errors, the state equation can be obtained as follows:

$$\dot{X} = FX + W \quad (26)$$

In the above formula, $$F = \begin{bmatrix} 0_{3\times3} & f^n \times & 0_{3\times3} & C_b^n \\ 0_{3\times3} & -\omega_{ie}^n \times & -C_b^n & 0_{3\times3} \\ 0_{3\times3} & 0_{3\times3} & 0_{3\times3} & 0_{3\times3} \\ 0_{3\times3} & 0_{3\times3} & 0_{3\times3} & 0_{3\times3} \end{bmatrix}, \quad W = \begin{bmatrix} C_b^n \nabla_w^b \\ -C_b^n \varepsilon_w^b \\ 0_{3\times1} \\ 0_{3\times1} \end{bmatrix} \quad (27)$$

In the equation (27), $\nabla_w^b$ and $\varepsilon_w^b$ are random white noises of the accelerometer and the gyroscope in a carrier coordinate system (b system) respectively. After comprehensive temperature compensation and elimination of a Warm-up factor, the output of the inertial instrument can be characterized as zero-mean normal distribution. In practical application, Allan variance is usually used to solve each model coefficient as a priori value of inertial instrument model estimation.

When the static base of a GMD system is aligned, the carrier is stationary, and the output speed $v^n$ of navigation solution is the speed error $\delta v^n$. If $\delta v^n$ is taken as the measured value, the measurement equation is:

$$Z_v = \delta v^n = [0_{3\times3} \; I_{3\times3} \; 0_{3\times3} \; 0_{3\times3}] X + V_v \quad (28)$$

in which, $V_v$ is the velocity measurement noise in the navigation coordinate system.

The embodiments of this application are described in detail above. For example, some words are used in the description and claims to refer to specific components. It should be understood by a person skilled in the art that hardware manufacturers may use different nouns to refer to the same component. In this description and claims, differences in names are not used as a way to distinguish components, but differences in functions of components are used as a criterion to distinguish components. As "include" and "comprise" mentioned in the whole description and claims are open-ended terms, they should be interpreted as "include/comprise but not limited to". "Generally" means that within the acceptable error range, a person skilled in the art can solve the technical problem within a certain error range and basically achieve the technical effect. The depiction of the description is a preferred embodiment for implementing this application, but the description is for the purpose of explaining the general principles of this application, and is not intended to limit the scope of this application. The scope of protection of this application shall be as defined in the appended claims.

It should be understood that the term "and/or" used in this paper is only a description of the association relationship of associated objects, which means that there can be three kinds of relationships, for example, A and/or B, which may mean that A exists alone, A and B exist at the same time, or B exists alone. In addition, the character "I" used herein generally indicates that the former and latter associated objects are in an "or" relationship.

The above description shows and describes several preferred embodiments of the application, but as mentioned above, it should be understood that the application is not limited to the form disclosed herein, and should not be regarded as an exclusion of other embodiments, but can be used in various other combinations, modifications and environments, and can be changed by the above teaching or the technology or knowledge in relevant fields within the scope of the application conception described herein. However, the modifications and changes made by a person skilled in the art do not depart from the spirit and scope of this application, and should be within the protection scope of the appended claims of this application.

What is claimed is:

1. A miniaturized resonant gyroscope for use in high-temperature environments, comprising a resonator, a circuit board, a piezoelectric element, a supporting base, a shell and a binding post, wherein the resonator is arranged in the shell and connected with the supporting base, the piezoelectric element is connected with the binding post through a metal conductor, and the circuit board realizes signal transmission, wherein key process points of elements of the gyroscope are fixedly connected by high-temperature materials and high-temperature processes, wherein key process points that are fixedly connected comprise fixedly connected points between the piezoelectric element and the resonator, between the binding post and the piezoelectric element, between the binding post and the circuit board, between the supporting base and the resonator and between the shell and the supporting base; and wherein the resonator also comprises a transition circuit board, a plurality of round holes are provided on a top of the resonator, and the metal conductor is fixedly connected with the binding post through the round holes.

2. The miniaturized resonant gyroscope according to claim 1, wherein the miniaturized resonant gyroscope is capable of working at a temperature of 125° C. or above.

3. The miniaturized resonant gyroscope according to claim 1, wherein welding points are provided on a top of a shell of the resonator, and welding and sealing are realized by using high-temperature materials.

4. The miniaturized resonant gyroscope according to claim 1, wherein the high-temperature materials comprise Sn—Ag, Sn—Cu or Sn—Ag—Cu alloys.

5. The miniaturized resonant gyroscope according to claim 1, wherein the supporting base is fixedly connected with the resonator, and a bottom of the supporting base is designed to have a conical shape, and is fixedly connected with an external structure through a pressing block.

6. The miniaturized resonant gyroscope according to claim 1, wherein the piezoelectric element is provided on a sidewall or at a bottom of the resonator; a high-temperature resistant damper is arranged on a periphery of the gyroscope; the supporting base and the high-temperature resistant damper are fixedly connected into an Inertial Measurement Unit (IMU).

7. An inertial navigation system, comprising:

a triaxial gyroscope, a triaxial accelerometer and a damper, the triaxial gyroscope being fixedly connected with the damper, wherein the triaxial gyroscope comprises a resonator, a circuit board, a piezoelectric element, a supporting base, a shell and a binding post, wherein the resonator is arranged in the shell and connected with the supporting base, the piezoelectric element is connected with the binding post through a metal conductor, and the circuit board realizes signal transmission, wherein key process points of elements of the triaxial gyroscope are fixedly connected by high-temperature materials and high-temperature processes, wherein key process points that are fixedly connected comprise fixedly connected points between the piezoelectric element and the resonator, between the binding post and the piezoelectric element, between the binding post and the circuit board, between the supporting base and the resonator and between the shell and the supporting base; and wherein the resonator also comprises a transition circuit board, a plurality of round holes are provided on a top of the resonator, and the metal conductor is fixedly connected with the binding post through the plurality of round holes.

8. The inertial navigation system according to claim 7, wherein the triaxial accelerometer is a high-temperature quartz flexible accelerometer or a high-temperature Micro-Electro-Mechanical System (MEMS) accelerometer; the inertial navigation system also comprises a sensor sensitive to geomagnetism.

9. A drilling measurement system, comprising the inertial navigation system according to claim 7, the drilling measurement system further comprises:

a combination of other sensor units, including a temperature sensor and an angle sensor;

a signal acquisition and processing unit, configured to acquire intermediate control variables from the inertial navigation system, the combination of other sensor units and a control and calibration unit, and complete signal processing and parameter compensation in the processing unit;

the control and calibration unit, configured to control and calibrate rotation of positions of the triaxial gyroscope and the measuring system, comprising but not limited to a gyro closed-loop control and calibration circuit and a rotation-modulated control circuit;

a state monitoring unit and a Gyro Measurement while Drilling (GMD) output unit, the state monitoring unit processes signals from a vibration monitoring sensor or an accelerometer; the GMD output unit includes a Measurement while Drilling (MWD) standard interface, which is used to output processed signals of the signal acquisition and processing unit;

a power supply unit, configured to supply power to the inertial navigation system, the combination of other sensor units, the signal acquisition and processing unit, the control and calibration unit, the state monitoring unit and the GMD output unit;

a shell structure, configured to accommodate the inertial navigation system and the combination of other sensor units, the signal acquisition and processing unit, the control and calibration unit, the state monitoring unit, the GMD output unit, and the power supply unit; and a rotating unit, configured to drive the measuring system to rotate.

10. The drilling measurement system according to claim 9, wherein the signal processing is performed in a processor, comprising a full parameter compensation module, a self-correction and self-calibration module, an initial alignment module, a continuous measurement while drilling module and a filter module.

11. A drilling measurement method, wherein the method is used in the drilling measurement system according to claim 9, comprising:

S1) judging whether a drill collar is static after receiving a ground drilling stop instruction by the measuring system, if so, starting coarse alignment at a first position, and if not, continuing to wait;

S2) finishing the coarse alignment, and taking information about an azimuth angle, a well inclination angle and a tool face angle output by the measuring system at an end of the coarse alignment as new coordinate vectors;

S3) entering a fine alignment process at a first position, and estimating new information about the azimuth angle, the well inclination angle and the tool face angle according to an observed quantity of velocity and an observed quantity of earth rotation angle rate;

S4) starting to rotate the measuring system and acquiring output of an angle sensor in real time;

S5) entering the fine alignment process at a second position, and estimating new information about the azimuth angle, the well inclination angle and the tool face angle by using a velocity vector and the observed quantity of velocity, an earth rotation angle rate vector and the observed quantity of earth rotation angle rate;

S6) finally calculating the azimuth angle, the well inclination angle and the tool face angle according to the information of the azimuth angle, the well inclination angle and the tool face angle of the first position and the second position, estimating bias errors of the triaxial gyroscope and the accelerometer, and feeding the bias errors back to an output model of an inertial instrument for correction; and S7) updating the errors and storing data after the alignment is finished.

12. The drilling measurement method according to claim 11, wherein in step S1), when an external instruction is given to stop drilling, firstly, a magnitude of mud vibration is judged according to an output signal filtered by the vibration monitoring sensor acquired by the state monitoring unit or an output signal of the accelerometer in the inertial navigation system, and whether to start coarse alignment is judged by a set threshold.

13. The drilling measurement method according to claim 11, wherein the coarse alignment includes directly using output information of the triaxial gyroscope installed on a carrier and output information of the accelerometer to obtain the information about the azimuth angle, the well inclination angle and the tool face angle of the carrier by an analytical method; in the fine alignment process, an optimal estimation algorithm is used for data fusion calculation to obtain new information about the azimuth angle, the well inclination angle and the tool face angle.

* * * * *